United States Patent
Kato et al.

(10) Patent No.: US 8,237,498 B2
(45) Date of Patent: Aug. 7, 2012

(54) DOHERTY AMPLIFIER SYSTEM AND TRANSMITTER USING THE SAME

(75) Inventors: Takayuki Kato, Kawasaki (JP); Atsushi Yamaoka, Kawasaki (JP); Keiichi Yamaguchi, Kawasaki (JP)

(73) Assignee: Kabushiki Kaisha Toshiba, Minato-ku, Tokyo (JP)

(*) Notice: Subject to any disclaimer, the term of this patent is extended or adjusted under 35 U.S.C. 154(b) by 0 days.

(21) Appl. No.: 13/402,643

(22) Filed: Feb. 22, 2012

(65) Prior Publication Data
US 2012/0154034 A1 Jun. 21, 2012

Related U.S. Application Data

(63) Continuation of application No. PCT/JP2009/064996, filed on Aug. 27, 2009.

(51) Int. Cl.
*H03F 3/68* (2006.01)

(52) U.S. Cl. .................... 330/124 R; 330/295

(58) Field of Classification Search .......... 330/295, 330/124 R, 261, 307
See application file for complete search history.

(56) References Cited

U.S. PATENT DOCUMENTS 7,764,120 B2 * 7/2010 Pengelly .................. 330/124 R

FOREIGN PATENT DOCUMENTS

| JP | 6164268 A | 6/1994 |
|---|---|---|
| JP | 10-004322 A | 1/1998 |
| JP | 2004-328710 A | 11/2004 |
| JP | 2006-333201 A | 12/2006 |
| JP | 2007-135015 A | 5/2007 |
| WO | 2008-044284 A1 | 4/2008 |
| WO | 2008/053534 A1 | 5/2008 |
| WO | 2011/024281 A1 | 3/2011 |

OTHER PUBLICATIONS

Kenington, Peter B.; "High Linearity RF Amplifier Design"; Artech House Microwave Library; 2000, 17 pages; ISBN 1-58053-143-1.
International Search Report dated Nov. 24, 2009 from PCT/JP2009/064996.

* cited by examiner

*Primary Examiner* — Robert Pascal
*Assistant Examiner* — Khiem Nguyen
(74) *Attorney, Agent, or Firm* — Ohlandt, Greeley, Ruggiero & Perle, L.L.P.

(57) ABSTRACT

According to an embodiment, a Doherty amplifier system has a first Doherty amplifier and a second Doherty amplifier. The first Doherty amplifier operates in a SISO communication mode and in a MIMO communication mode. The first Doherty amplifier comprises a first carrier amplifier and a first peak amplifier. The second Doherty amplifier operates in the MIMO communication mode but not operates in the SISO communication mode. The second Doherty amplifier comprises a second carrier amplifier and a second peak amplifier. A distance between the first carrier amplifier and the second carrier amplifier is less than any of a distance between any of the first carrier amplifier and the second peak amplifier and any of the first peak amplifier and the second peak amplifier. In the SISO communication mode, heat generated by the first Doherty amplifier is conducted to the second Doherty amplifier to warm up the second Doherty amplifier.

12 Claims, 7 Drawing Sheets

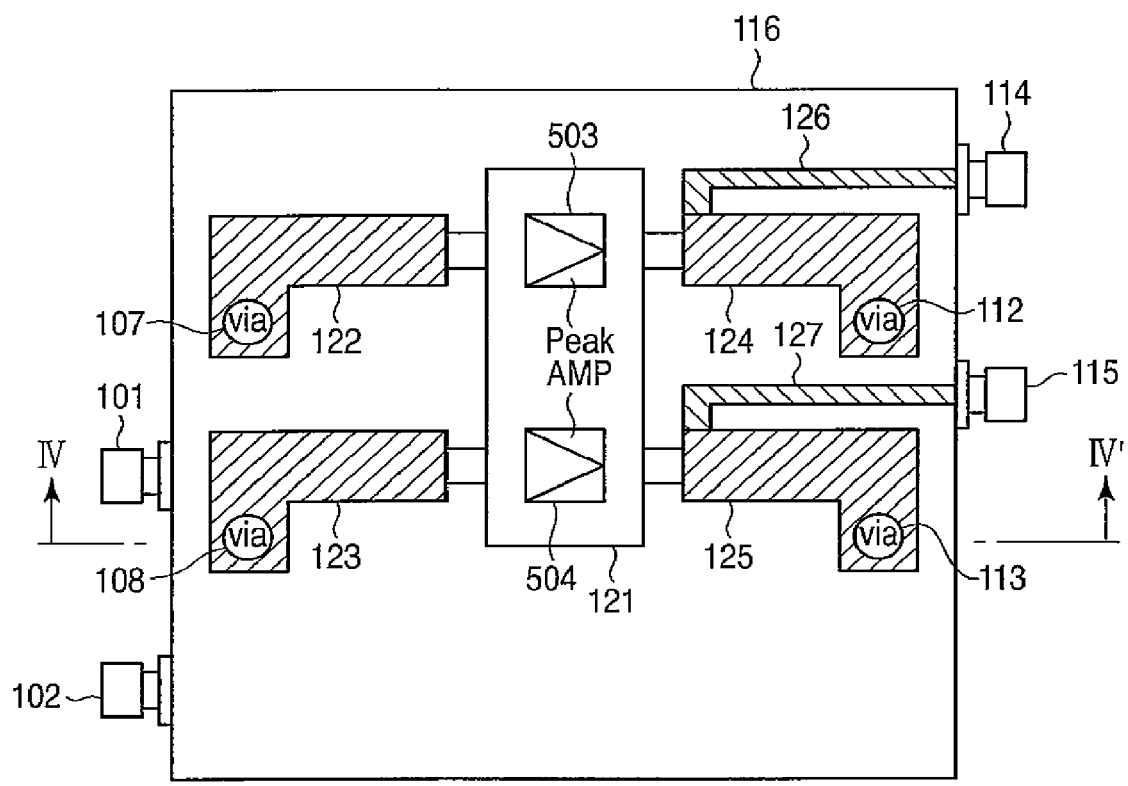
F I G. 3
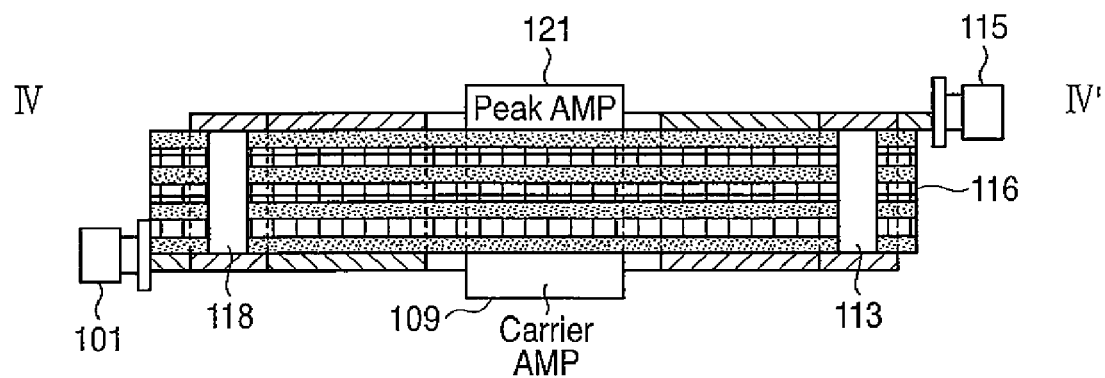
F I G. 4

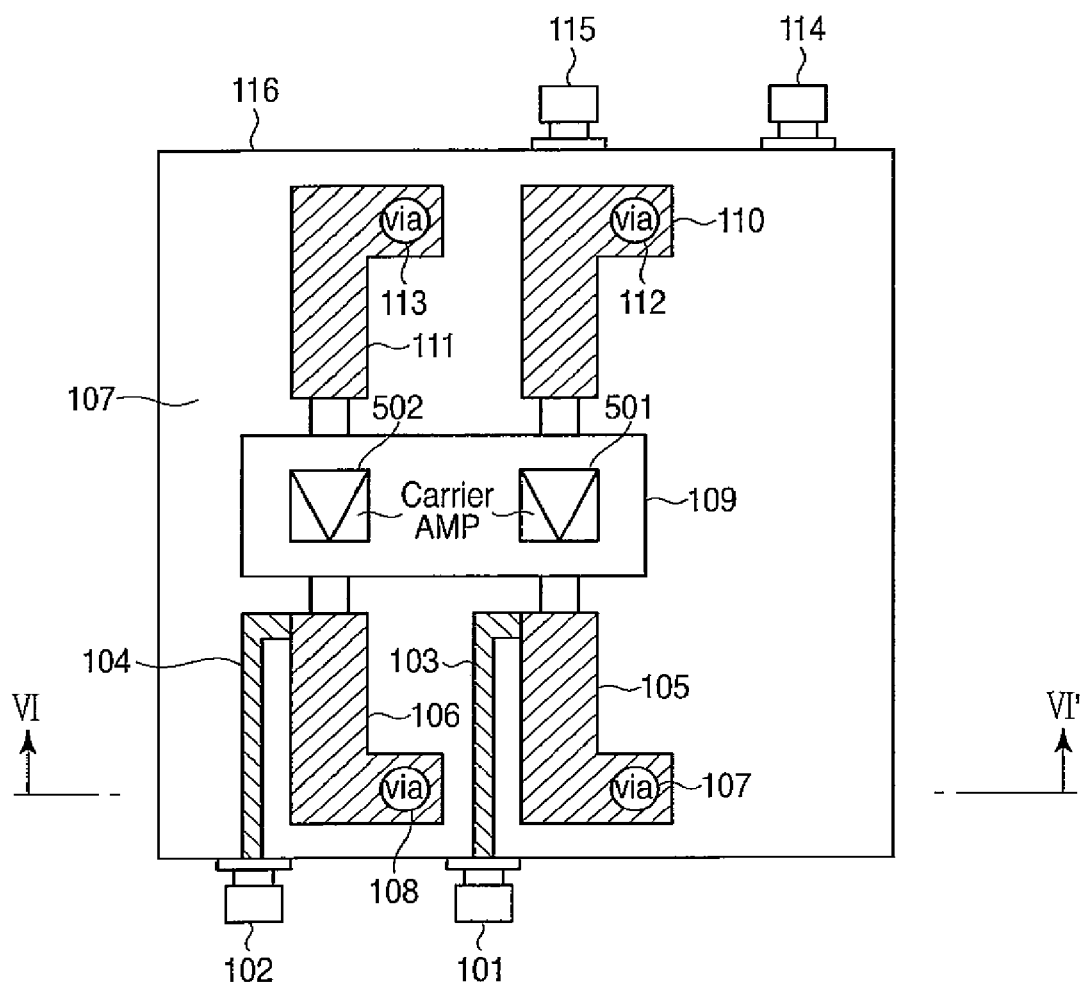
F I G. 5
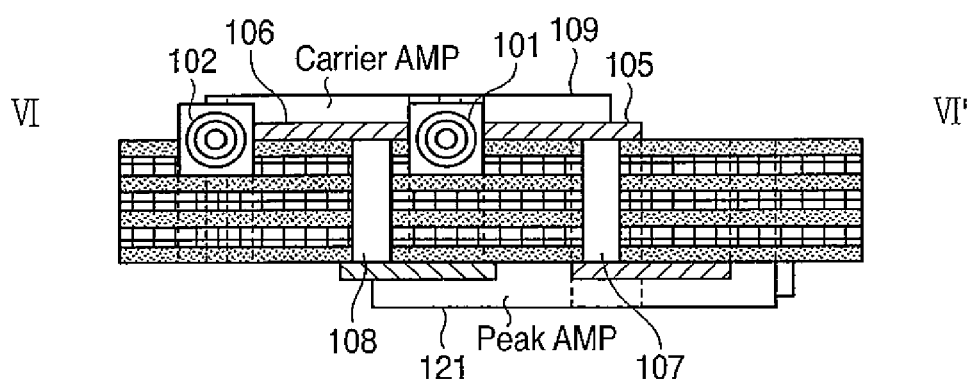
F I G. 6

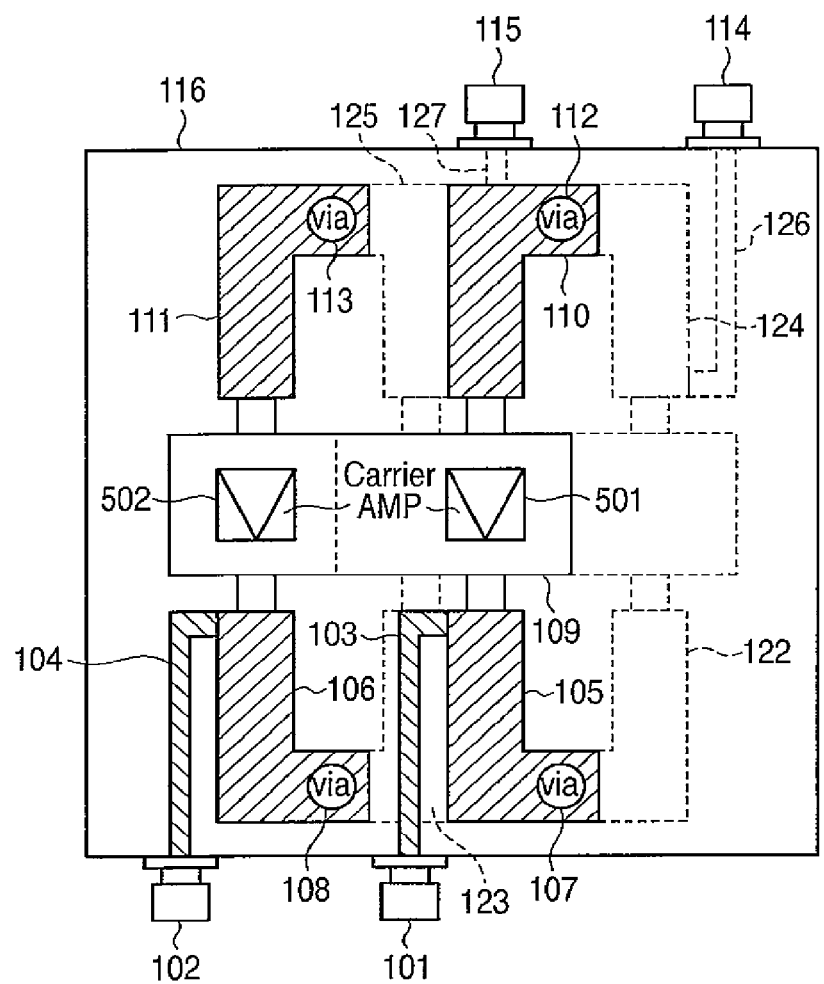
F I G. 7
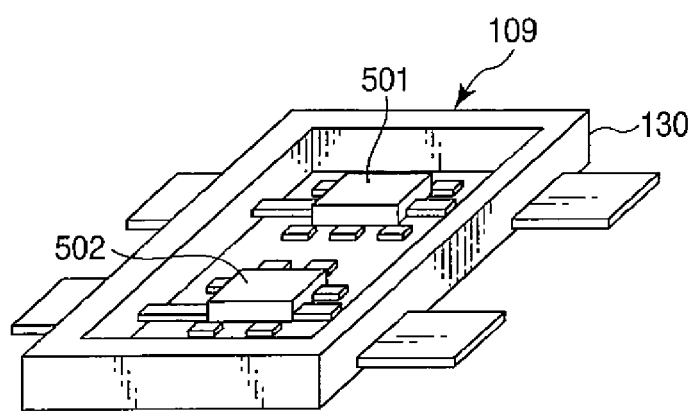
F I G. 8

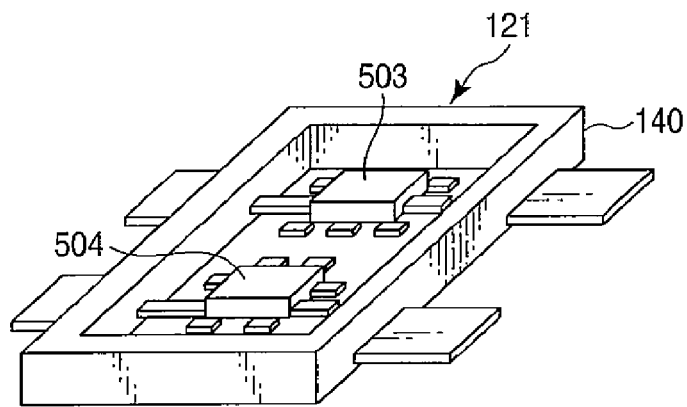
F I G. 9
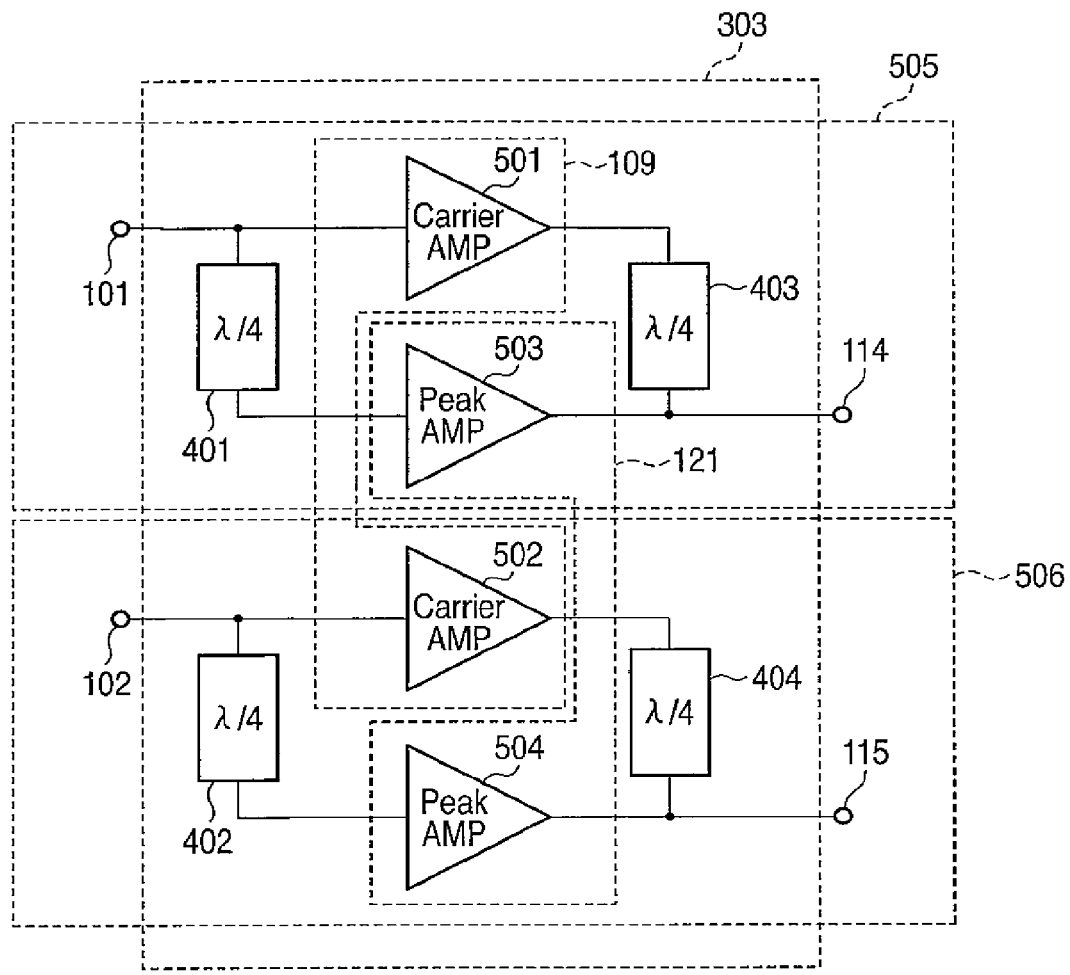
F I G. 10

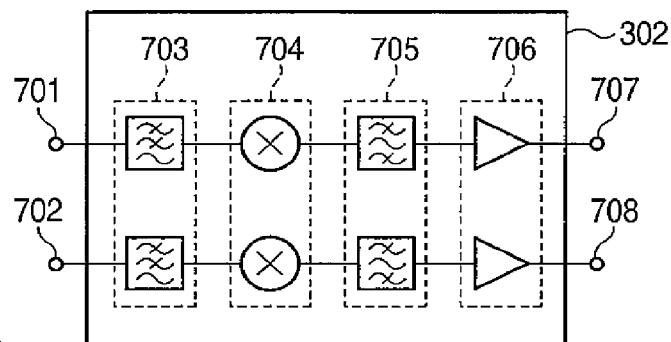
F I G. 13
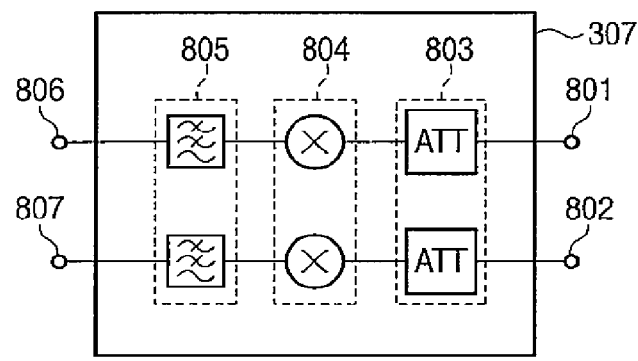
F I G. 14
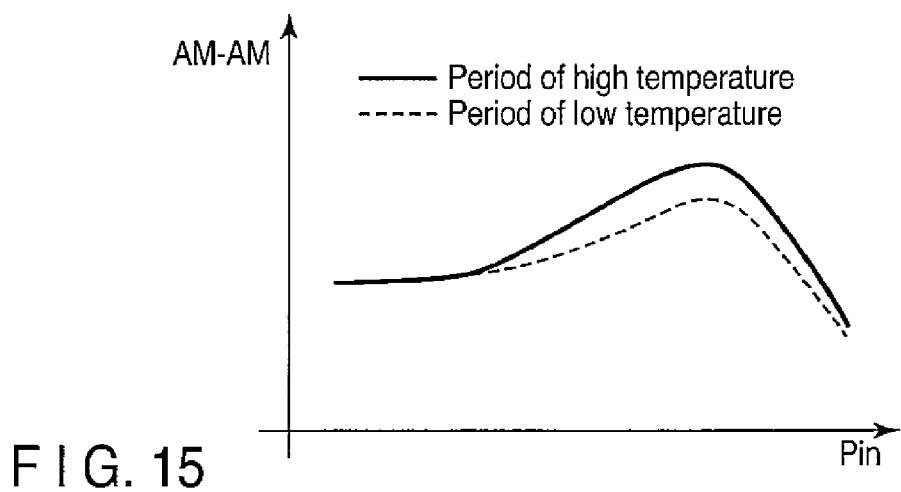
F I G. 15

DOHERTY AMPLIFIER SYSTEM AND TRANSMITTER USING THE SAME

CROSS REFERENCE TO RELATED APPLICATIONS

This application is a Continuation Application of PCT Application No. PCT/JP2009/064996, filed Aug. 27, 2009, the entire contents of which are incorporated herein by reference.

FIELD

Embodiments described herein relate generally to warm-up of a power amplifier.

BACKGROUND

[Peter B. kenington, "High Linearity RF Amplifier Design", Artech house Microwave Library, ISBN 1-58053-143-1.] and the like propose a Doherty amplifier as an efficient power amplifier. The Doherty amplifier includes a carrier amplifier and a peak amplifier. The carrier amplifier operates constantly while the Doherty amplifier is in operation. The peak amplifier operates when the Doherty amplifier outputs high power. The carrier amplifier and the peak amplifier may have different temperatures owing to the different operating time and operating efficiencies thereof.

A power amplifier has I/O characteristics that vary depending on temperature. That is, the nonlinearity of the power amplifier varies depending on temperature, and thus the temperature is adjusted (by warm-up and the like) to allow the power amplifier to be used within a desired temperature range. For example, a transmission amplifier described in JP-A 2004-328710 (KOKAI) (for example, page 16 and FIG. 1) includes means for detecting temperature and means for promoting self-heating of an amplification section. Based on the results of temperature detection, the transmission amplifier controls the means for promoting to carry out warm-up.

BRIEF DESCRIPTION OF THE DRAWINGS

FIG. 3 is a plan view of the Doherty amplifier system according to the embodiment;

FIG. 4 is a cross-sectional view taken along line IV-IV' in FIG. 3;

FIG. 5 is a plan view of the Doherty amplifier system according to the embodiment;

FIG. 6 is a cross-sectional view taken along line VI-VI' in FIG. 5;

FIG. 7 is a plan view of the Doherty amplifier system according to the embodiment;

FIG. 8 is a diagram showing an example of implementation of a carrier amplifier group in the Doherty amplifier system according to the embodiment;

FIG. 9 is a diagram showing an example of implementation of a peak amplifier group in the Doherty amplifier system according to the embodiment;

FIG. 10 is a block diagram showing the Doherty amplifier system in FIG. 11;

FIG. 13 is a block diagram showing a radio processor in FIG. 11;

FIG. 14 is a block diagram showing a radio demodulator in FIG. 11; and

FIG. 15 is a graph showing an example of a variation in the nonlinearity of a power amplifier which depends on temperature.

DETAILED DESCRIPTION

Figure 1:
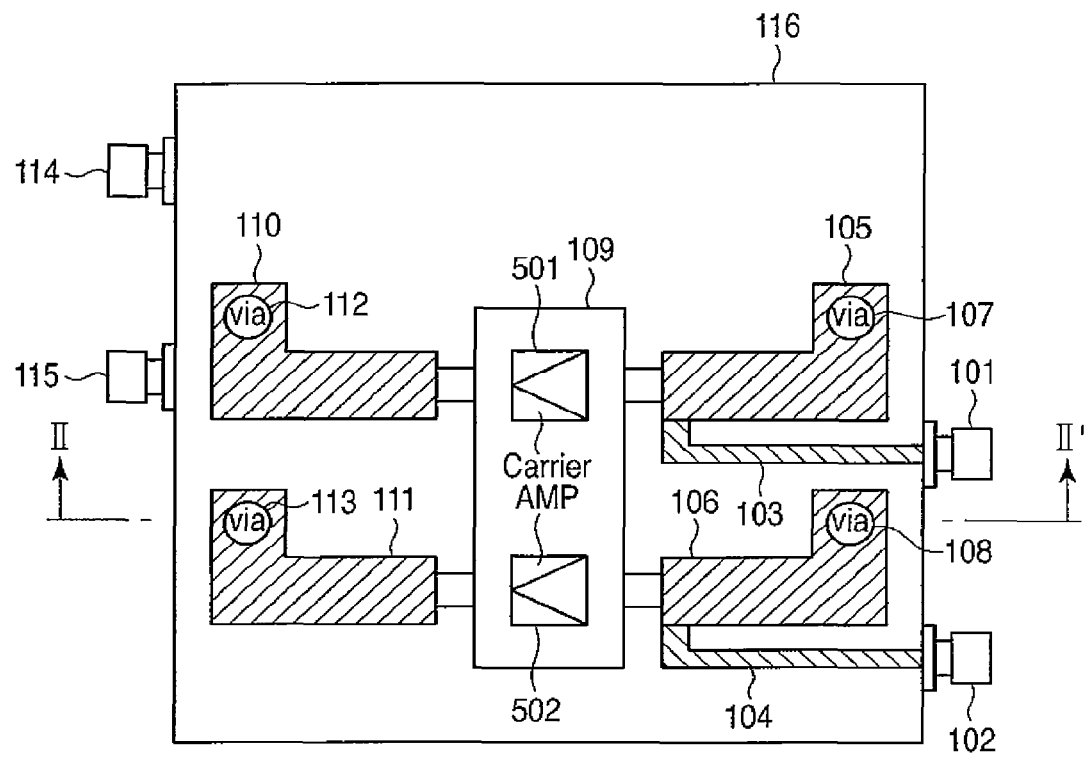
FIG. 1 is a plan view of a Doherty amplifier system according to an embodiment.

Embodiments will be described below with reference to the drawings.

In general, according to an embodiment, a Doherty amplifier system has a substrate, a first Doherty amplifier and a second Doherty amplifier. The substrate has a front surface and a back surface. The first Doherty amplifier operates in a SISO communication mode and in a MIMO communication mode. The first Doherty amplifier comprises a first carrier amplifier and a first peak amplifier, each arranged on one of the surfaces of the substrate. The second Doherty amplifier operates in the MIMO communication mode but not operates in the SISO communication mode. The second Doherty amplifier comprises a second carrier amplifier and a second peak amplifier, each arranged on one of the surfaces of the substrate. A distance between the first carrier amplifier and the second carrier amplifier is less than any of a distance between the first carrier amplifier and the first peak amplifier, a distance between the first carrier amplifier and the second peak amplifier, a distance between the second carrier amplifier and the first peak amplifier, and a distance between the second carrier amplifier and the second peak amplifier. A distance between the first peak amplifier and the second peak amplifier is less than any of the distance between the first carrier amplifier and the first peak amplifier, the distance between the first carrier amplifier and the second peak amplifier, the distance between the second carrier amplifier and the first peak amplifier, and the distance between the second carrier amplifier and the second peak amplifier. In the SISO communication mode, heat generated by the first Doherty amplifier is conducted to the second Doherty amplifier to warm up the second Doherty amplifier which operates in the MIMO communication mode following the SISO communication mode.

Embodiment

A Doherty amplifier system according to an embodiment includes a multilayer substrate 116, and a carrier amplifier group 109 and a peak amplifier group 121 arranged on the substrate 116. The term "Doherty amplifier system" as used herein refers to a plurality of Doherty amplifiers as a whole which are used for MIMO communication, for example. The carrier amplifier group 109 includes a plurality of carrier amplifiers in the plurality of Doherty amplifiers. The plurality of carrier amplifiers are arranged on the multilayer substrate 116 in proximity to one another. The peak amplifier group 121 includes a plurality of peak amplifiers in the plurality of Doherty amplifiers. The plurality of peak amplifiers are arranged on the multilayer substrate 116 in proximity to one another. The phrase "the plurality of carrier amplifiers are arranged in proximity to one another" means that, for example, the distance between any two of the plurality of carrier amplifiers is less than that between any one of the plurality of carrier amplifiers and any one of the plurality of peak amplifiers. Furthermore, the phrase "the plurality of peak amplifiers are arranged in proximity to one another" means that, for example, the distance between any two of the plurality of peak amplifiers is less than that between any one of the plurality of peak amplifiers and any one of the plurality of carrier amplifiers. In the following description, each of the carrier amplifier group 109 and the peak amplifier group 121 is assumed to include two amplifies but may include three or more amplifiers. Furthermore, in the following example, it is assumed that the carrier amplifier group 109 is arranged on one surface of the multilayer substrate 116, whereas the peak amplifier group 121 is arranged on the opposite surface of the multiplayer substrate 116. However, both the carrier amplifier group 109 and peak amplifier group 121 may be arranged on one surface.

FIG. 1, FIG. 5, and FIG. 7 show a surface of the multilayer substrate 116 on which the carrier amplifier group 109 is arranged. FIG. 7 shows, as dashed lines, elements of a surface of the multilayer substrate 116 on which the peak amplifier group 121 is arranged.

Figure 2:
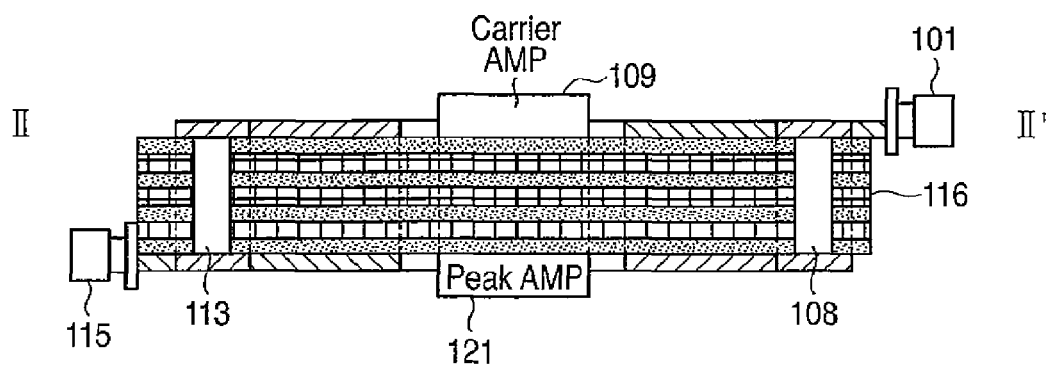
FIG. 2 is a cross-sectional view taken along line II-II' in FIG. 1.

FIG. 2 shows a cross section taken along line II-II' in FIG. 1. FIG. 6 shows a cross section taken along line VI-VI' in FIG. 5.

The carrier amplifier group 109 includes a first carrier amplifier 501 in a first Doherty amplifier 505 and a second carrier amplifier 502 in a second Doherty amplifier 506.

A first input terminal 101 receives an input signal to the first Doherty amplifier 505. The input signal received by the first input terminal 101 is fed to the first carrier amplifier 501 via a signal input line 103 and to the opposite surface (on which the peak amplifier group 121 is arranged) of the multilayer substrate 116 via an impedance converter 105 and a conductive via 107. An output signal from the first carrier amplifier 501 is fed to the opposite surface of the multilayer substrate 116 via an impedance converter 110 and a conductive via 112.

A second input terminal 102 receives an input signal to the second Doherty amplifier 506. The input signal received by the second input terminal 102 is fed to the second carrier amplifier 502 via a signal input line 104 and to the opposite surface of the multilayer substrate 116 via an impedance converter 106 and a conductive via 108. An output signal from the second carrier amplifier 502 is fed to the opposite surface of the multilayer substrate 116 via an impedance converter 111 and a conductive via 113.

FIG. 3 shows the surface of the multilayer substrate 116 on which the peak amplifier group 121 is arranged. FIG. 4 shows a cross section taken along line IV-IV' in FIG. 3.

The peak amplifier group 121 includes a first peak amplifier 503 in the first Doherty amplifier 505 and a peak carrier amplifier 504 in the second Doherty amplifier 506.

An input signal fed from the opposite surface of the multilayer substrate 116 (on which the carrier amplifier group 109 is arranged) via the conducive via 107 is further fed to the first peak amplifier 503 via an impedance converter 122. An output signal from the first peak amplifier 503 is synthesized with an output signal fed from the opposite surface of the multilayer substrate 116 via the conductive via 112. The resultant signal is output from a first output terminal 114 via a signal output line 126.

An input signal fed from the opposite surface of the multilayer substrate 116 via the conducive via 108 is further fed to the second peak amplifier 504 via an impedance converter 123. An output signal from the second peak amplifier 504 is synthesized with an output signal fed from the opposite surface of the multilayer substrate 116 via the conductive via 113. The resultant signal is output from a second output terminal 115 via a signal output line 127.

The technical significance of the Doherty amplifier system according to the present embodiment will be described below.

FIG. 15 shows an example of a variation in the nonlinear characteristic of power amplifiers such as a carrier amplifier and a peak amplifier which depends on temperature. In FIG. 15, the abscissa represents input power Pin. The ordinate represents an AM-AM characteristic indicative of the nonlinear characteristic of gains of the power amplifiers. As is apparent from FIG. 15, the nonlinear characteristic of the power amplifiers varies depending on the temperature thereof. The nonlinear characteristic of needs to be referred in order to compensate for distortion as described below. Thus, a significant variation in the temperature of the power amplifier may prevent distortion from being sufficiently compensated for.

A MIMO communication mode uses a plurality of Doherty amplifiers. A single-input, single-output (SISO) communication mode uses one Doherty amplifier. Here, it is assumed that a transmitter using a Doherty amplifier system changes from the MIMO communication mode to the SISO communication mode and then back to the MIMO communication mode. In the initial MIMO communication mode, a plurality of Doherty amplifiers operate, and a corresponding pre-distortion characteristic is held in, for example, a memory in a digital signal processor for distortion compensation. Then, when the MIMO communication mode changes to the SISO communication mode, one Doherty amplifier continues to operate, whereas the others stop operating. The Doherty amplifier that is inactive in the SISO communication mode continues to decrease in temperature. Then, when the SISO communication mode changes back to the MIMO communication mode, the Doherty amplifier that was inactive in the SISO communication mode restarts operating. However, the Doherty amplifier having restarted operating has been reduced in temperature in the SISO communication mode. Thus, it may be failed to sufficiently compensate for the distortion of the Doherty amplifier even with the use of the pre-distortion characteristic held in the last MIMO communication mode.

On the other hand, as described above, in the Doherty amplifier system according to the present embodiment, the plurality of carrier amplifiers are arranged in proximity to one another to form the carrier amplifier group 109. Furthermore, the plurality of peak amplifiers are arranged in proximity to one another to form the peak amplifier group 121. That is, the plurality of carrier amplifiers in the plurality of Doherty amplifiers are arranged in proximity to one another. The plurality of peak amplifiers in the plurality of Doherty amplifiers are arranged in proximity to one another. Hence, in the SISO communication mode, heat generated by the carrier amplifiers and peak amplifiers in one active Doherty amplifier is conducted via the multilayer substrate 116 to warm up the carrier amplifiers and peak amplifiers in the inactive Doherty amplifiers. The degree of the warm-up depends on the distance between the carrier amplifiers, the thermal conductivity of the multilayer substrate 116, and the like.

In general, the temperature difference between a heat source and a measurement point is expressed by:

$$\text{Temperature difference [K]} = \text{Thermal resistance} \left[\frac{K}{W}\right] \times \text{Heat flow [W]} \quad (1)$$

Thus, the temperature difference is determined by the quantity of heat generated by the heat source and the length and cross-sectional area of a medium through which heat is conducted from the heat source to the measurement point.

In the present embodiment, for example, the heat source is an active carrier amplifier or peak amplifier. The measurement point is an inactive carrier amplifier or peak amplifier. The temperature difference between two amplifiers, that is, a temperature for warm-up, is determined depending on a method for compensating for the distortion of the power amplifier and a specification for distortion. The determination of the temperature for warm-up is followed by the determination of the distance between two amplifiers at which the amplifiers are arranged in proximity to each other, that is, the positions at which the two amplifiers are arranged.

For example, it is assumed that the temperature difference between two amplifiers is 50° C., that the carrier amplifier has an operating efficiency of 50%, and that the carrier amplifier has an average output power of 50 W. Then, the average quantity of heat generated is 50 W, and thermal resistance is 1° C./W in accordance with Expression (1). Two carrier amplifiers or peak amplifiers are implemented so as to achieve the thermal resistance.

If the heat source includes not only an active carrier amplifier but also an active peak amplifier mounted on the back surface of the substrate, the distance between each of these two amplifiers and an amplifier to be warmed up is calculated in the same manner.

To make warm-up more efficient, the arrangement of the carrier amplifiers in the carrier amplifier group 109 and the peak amplifiers in the peak amplifier group 121 may be modified. For example, the quantity of heat generated by the carrier amplifiers and the peak amplifiers increases consistently with the operating time. Thus, this nature can be utilized for the arrangement of the carrier amplifiers and the peak amplifiers. Specifically, the carrier amplifiers and the peak amplifiers are arranged such that an amplifier with the longest operating time is located at one point of the arrangement and that the operating time of each of the other amplifiers decreases with increasing distance from the amplifier with the longest operating time. This allows carrier amplifiers and peak amplifiers with longer operating time to be maintained at an appropriate temperature.

Furthermore, when the carrier amplifier group 109 is arranged on one surface of the multilayer substrate 116, whereas the peak amplifier group 121 is arranged on the opposite surface of the multilayer substrate 116, as in the case of the Doherty amplifier system according to the present embodiment, heat from the carrier amplifier group 109 can be conducted to the peak amplifier group 121. In general, the peak amplifier, which operates intermittently, is likely to be colder than the carrier amplifier, which operates constantly. However, this arrangement allows the peak amplifier group 121 to be maintained at the appropriate temperature.

To further improve the warm-up performance of the Doherty amplifier system according to the present embodiment, the carrier amplifiers 501 and 502, included in the carrier amplifier group 109, are desirably accommodated in an enclosure 130 having a higher thermal conductivity than the multilayer substrate 116, as shown in FIG. 8. A material for the enclosure 130 is, for example, aluminum nitride. Aluminum nitride has a thermal conductivity of about 100 to about 300 W/mK. The thermal conductivity required for the enclosure 130 depends on the warm-up performance required for the carrier amplifier group 109 but is desirably at least about 80 W/mK.

Furthermore, to further improve the warm-up performance of the Doherty amplifier system according to the present embodiment, the peak amplifiers 503 and 504, included in the peak amplifier group 121, are desirably accommodated in an enclosure 140 having a higher thermal conductivity than the multilayer substrate 116, as shown in FIG. 9. A material for the enclosure 140 is, for example, the same as that for the enclosure 130.

Figure 11:
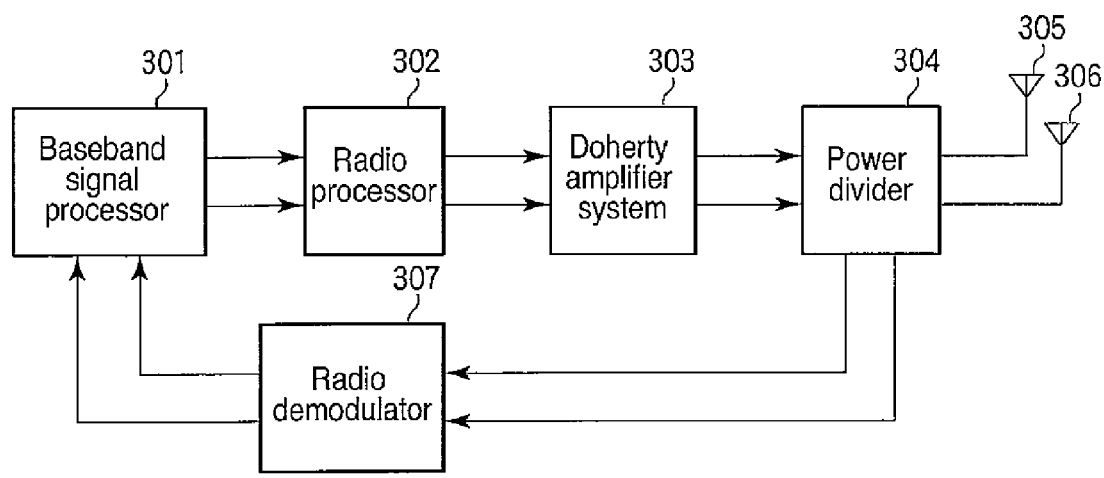
FIG. 11 is a block diagram showing a transmitter using the Doherty amplifier system according to the embodiment.

As shown in FIG. 11, a transmitter can be implemented by using the Doherty amplifier system according to the present embodiment. The transmitter in FIG. 11 includes a baseband signal processor 301, a radio processor 302, a Doherty amplifier system 303, a power divider 304, antennas 305 and 306, and a radio demodulator 307. The transmitter in FIG. 11 can operate both in the SISO communication mode and in the MIMO communication mode. In the present example, the number of inputs and outputs for MIMO communication is two, but may be three or more.

Figure 12:
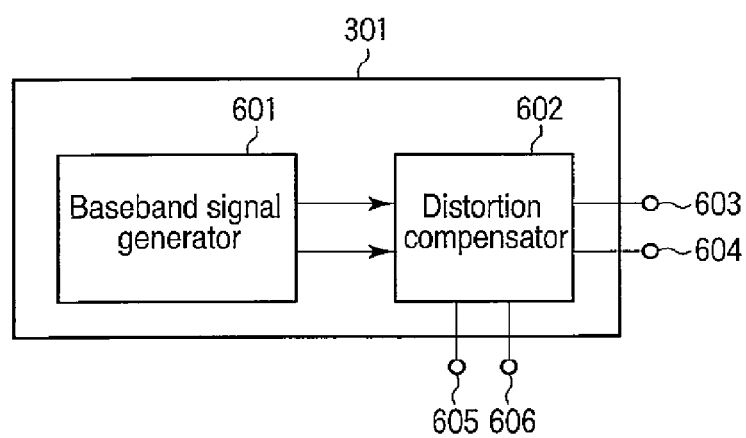
FIG. 12 is a block diagram showing a baseband signal processor in FIG. 11.

The baseband signal processor 301 processes a baseband signal to be transmitted. The baseband signal processor 301 includes a baseband signal generator 601, a distortion compensator 602, signal output terminals 603 and 604, and signal input terminals 605 and 606, for example, as shown in FIG. 12.

The baseband signal generator 601 generates a baseband signal to be transmitted. The baseband signal to be transmitted is, for example, an IQ complex baseband signal. In the SISO communication mode, the baseband signal generator 601 generates a first baseband signal and inputs it to the distortion compensator 602. In the MIMO communication mode, the baseband signal generator 601 generates a first baseband signal and a second baseband signal and inputs them to the distortion compensator 602.

The distortion compensator 602 subjects the baseband signal from the baseband signal generator 601 to processing for compensating for the nonlinear distortion characteristic introduced by the Doherty amplifier system 303. More specifically, the distortion compensator 602 multiplies the baseband signal by a pre-distortion characteristic corresponding to the nonlinear distortion characteristic of the Doherty amplifier system 303. In the present example, since the Doherty amplifier system 303 includes the first Doherty amplifier 505 and the second Doherty amplifier 506, the distortion compensator 602 allows the pre-distortion characteristics corresponding to the first Doherty amplifier 505 and the second Doherty amplifier 506 to be individually stored in a memory. The pre-distortion characteristics are appropriately updated by monitoring the nonlinear distortion characteristics of the first Doherty amplifier 505 and the second Doherty amplifier 506. The specific content of this update process will be described below.

In the SISO communication mode, the distortion compensator 602 multiplies a first baseband signal by the pre-distortion characteristic corresponding to the first Doherty amplifier 505. The distortion compensator 602 then outputs the resultant signal through the first signal output terminal 603. Furthermore, in the SISO communication mode, the distortion compensator 602 monitors the nonlinear characteristic of the first Doherty amplifier 505 based on an input signal from the first signal input terminal 605. In the MIMO communication mode, the distortion compensator 602 multiplies a first baseband signal by the pre-distortion characteristic corresponding to the first Doherty amplifier 505. The distortion compensator 602 then outputs the resultant signal through the first signal output terminal 603. The distortion compensator 602 also multiplies a second baseband signal by the pre-distortion characteristic corresponding to the second Doherty amplifier 506. The distortion compensator 602 then outputs the resultant signal through the second signal output terminal 604. Furthermore, in the MIMO communication mode, the distortion compensator 602 monitors the nonlinear characteristics of the first Doherty amplifier 505 and the second Doherty amplifier 506 based on input signals from the first signal input terminal 605 and the second signal input terminal 606.

The radio processor 302 carries out signal processing for converting the baseband signal from the baseband signal processor 301 into a radio-frequency (RF) signal. The radio processor 302 includes signal input terminals 701 and 702, a low-pass filter group 703, a mixer group 704, a bandpass filter group 705, a driver amplifier group 706, and signal output terminals 707 and 708.

The low-pass filter group 703 subjects a baseband signal input by the baseband signal processor 301 to filter processing for suppressing high-frequency components of the baseband signal to extract low-frequency components. Specifically, in the SISO communication mode, the low-pass filter group 703 carries out the filter processing on a first baseband signal input from the first signal input terminal 701. Furthermore, in the MIMO communication mode, the low-pass filter group 703 carries out the filter processing on each of a first baseband signal input from the first signal input terminal 701 and a second baseband signal input from the second signal input terminal 702.

The mixer group 704 is what is called a group of frequency converters (a group of upconverters). The mixer group 704 multiplies the baseband signal from the low-pass filter group 703 by the local signal to obtain a multiplied signal. Specifically, in the SISO communication mode, the mixer group 704 multiplies the first baseband signal input by the low-pass filter group 703, by a first local signal to obtain a first multiplied signal. Furthermore, in the MIMO communication mode, the mixer group 704 multiplies the first baseband signal and second baseband signal input by the low-pass filter group 703, by a first local signal and a second local signal, respectively, to obtain a first multiplied signal and a second multiplied signal, respectively.

The bandpass filter group 705 subjects the multiplied signal from the mixer group 704 to filter processing for suppressing out-of-band components to extract in-band components. The bandpass filter group 705 thus obtains an RF signal. Specifically, in the SISO communication mode, the bandpass filter group 705 carries out the filter processing on the first multiplied signal input by the mixer group 704 to obtain a first RF signal. In the MIMO communication mode, the bandpass filter group 705 carries out the filter processing on the first multiplied signal and second multiplied signal input by the mixer group 704 to obtain a first RF signal and a second RF signal, respectively.

The driver amplifier group 706 amplifies the power of the RF signal from the bandpass filter group 705. Specifically, in the SISO communication mode, the driver amplifier group 706 amplifies the power of the first RF signal input by the bandpass filter group 705. The driver amplifier group 706 then outputs the resultant signal through the first signal output terminal 707. Furthermore, in the MIMO communication mode, the driver amplifier group 706 amplifies the power of each of the first RF signal and second RF signal input by the bandpass filter group 705. The driver amplifier group 706 then outputs the resultant signals through the first signal output terminal 707 and the second signal output terminal 708, respectively.

The Doherty amplifier system 303 is, for example, a Doherty amplifier system shown in FIG. 1 to FIG. 7. The Doherty amplifier system 303 amplifies the power of an RF signal input by the radio processor 302. For example, as shown in FIG. 10, the Doherty amplifier system 303 includes the first Doherty amplifier 505 and the second Doherty amplifier 506. In the SISO communication mode, the Doherty amplifier system 303 allows the first Doherty amplifier 505 to amplify the power of a first RF signal input by the radio processor 302. Furthermore, in the MIMO communication mode, the Doherty amplifier system 303 allows the first Doherty amplifier 505 to amplify the power of a first RF signal input by the radio processor 302, while allowing the second Doherty amplifier 506 to amplify the power of a second RF signal input by the radio processor 302.

The specific content of operation of the first Doherty amplifier 505 and the second Doherty amplifier 506 may be defined on the basis of a design concept. For example, while the Doherty amplifier is in operation, the carrier amplifier operates constantly. In contrast, the peak amplifier operates only when outputting a high-power signal at or above a level that is 6 dB lower than a saturation output level of the Doherty amplifier. When the high-power signal is amplified, the power distribution ratio of the carrier amplifier to the peak amplifier is, for example, 1:1.

The first Doherty amplifier 505 includes the input terminal 101, the carrier amplifier 501, the peak amplifier 503, the impedance conversion circuits 401 and 403, and the output terminal 114. The impedance conversion circuit 401 includes the impedance converter 105, the conductive via 107, and the impedance converter 122, all of which have been described above. The impedance conversion circuit 403 includes the impedance converter 110, the conductive via 112, and the impedance converter 124, all of which have been described above. Desirably, the impedance conversion circuits 401 and 403 provide a substantially equal impedance conversion function that is, for example, equivalent to that of a transmission line having an electrical length one quarter of the wavelength of a signal amplified by the first Doherty amplifier 505. Furthermore, desirably, the impedance converters 105, 110, 122, and 124 provide an equal impedance conversion function.

The second Doherty amplifier 506 includes the input terminal 102, the carrier amplifier 502, the peak amplifier 504, the impedance conversion circuits 402 and 404, and the output terminal 115. The impedance conversion circuit 402 includes the impedance converter 106, the conductive via 108, and the impedance converter 123, all of which have been described above. The impedance conversion circuit 404 includes the impedance converter 111, the conductive via 113, and the impedance converter 125, all of which have been described above. Desirably, the impedance conversion circuits 402 and 404 provide a substantially equal impedance conversion function that is, for example, equivalent to that of a transmission line having an electrical length one quarter of the wavelength of a signal amplified by the second Doherty amplifier 506. Furthermore, desirably, the impedance converters 106, 111, 123, and 125 provide an equal impedance conversion function.

The power divider 304 distributes the power of an amplification signal from the Doherty amplifier system 303. The power divider 304 can be implemented by a directional coupler. Specifically, in the SISO communication mode, the power divider 304 outputs a part (for example, one-tenth) of the power of a first amplification signal input by the Doherty amplifier system 303, to the radio demodulator 307. The power divider 304 outputs the remaining power to the antenna 305. Furthermore, in the MIMO communication mode, the power divider 304 outputs each of a part of the power of a first amplification signal input by the Doherty amplifier system 303 and a part of the power of a second amplification signal input by the Doherty amplifier system 303, to the radio demodulator 307. The power divider 304 outputs the remaining power to the antenna 305 and 306, respectively.

In the SISO communication mode and the MIMO communication mode, the antenna 305 radiates a first RF signal input by the power divider 304 to the space. In the MIMO communication mode, the antenna 306 radiates a second RF signal input by the power divider 304 to the space.

The radio demodulator 307 demodulates an RF signal from the power divider 304. The radio demodulator 307 includes signal input terminal 801 and 802, an attenuator group 803, a mixer group 804, a low-pass filter group 805, and signal output terminals 806 and 807, for example, as shown in FIG. 14.

The attenuator group 803 attenuates the power of an RF signal input by the power divider 304. Specifically, in the SISO communication mode, the attenuator group 803 attenuates the power of a first RF signal input from the first signal input terminal 806. Furthermore, in the MIMO communication mode, the attenuator group 803 attenuates the power of each of a first RF signal input from the first signal input terminal 806 and a second RF signal input from the second signal input terminal 807.

The mixer group 804 is what is called a group of frequency converters (a group of downconverters). The mixer group 804 multiplies the RF signal from the attenuator group 803 by a local signal to obtain a multiplied signal. Specifically, in the SISO communication mode, the mixer group 804 multiplies the first RF signal input by the attenuator group 803, by a first local signal to obtain a first multiplied signal. Furthermore, in the MIMO communication mode, the mixer group 804 multiplies the first RF signal and second RF signal input by the attenuator group 803, by a first local signal and a second local signal, respectively, to obtain a first multiplied signal and a second multiplied signal, respectively.

The low-pass filter group 805 subjects the multiplied signal input by the mixer group 804 to filter processing for suppressing high-frequency components of the multiplied signal to extract low-frequency components. Specifically, in the SISO communication mode, the low-pass filter group 805 carries out the filter processing on the first multiplied signal input by the mixer group 804. The low-pass filter group 805 then outputs the resultant signal from the first signal output terminal 806 as a first demodulated IQ baseband signal. Furthermore, in the MIMO communication mode, the low-pass filter group 805 carries out the filter processing on each of the first multiplied signal and second multiplied signal input by the mixer group 804. The low-pass filter group 805 then outputs the resultant signals from the first signal output terminal 806 and the second signal output terminal 807 as a first demodulated IQ baseband signal and a second demodulated IQ baseband signal, respectively.

As described above, the distortion compensator 602 monitors the nonlinear distortion characteristic of the Doherty amplifier system 303. The demodulated IQ baseband signals output from the signal output terminals 806 and 807 are input to the compensator 602 via the signal input terminals 605 and 606, respectively. The distortion compensator 602 compares the demodulated IQ baseband signal with an IQ baseband signal input by the baseband signal generator 601 to calculate the nonlinear distortion characteristic of the Doherty amplifier system 303. The distortion compensator 602 updates the pre-distortion characteristic stored in the memory so as to set the distortion component of the demodulated IQ baseband signal to be within a predetermined range. The predetermined range is a distortion range required for the transmitter in FIG. 11 as a specification.

As described above, in the Doherty amplifier system according to the present embodiment, the plurality of carrier amplifiers are arranged in proximity to one another so as to form the carrier amplifier group 109. Furthermore, the plurality of peak amplifiers are arranged in proximity to one another so as to form the peak amplifier group 121. Thus, in the Doherty amplifier system according to the present embodiment, even if some Doherty amplifiers are inactive, active carrier amplifiers and peak amplifiers enable the inactive carrier amplifiers and peak amplifiers to be warmed up. That is, the power amplifiers can be efficiently warmed up even without the means for detecting temperature or the means for promoting self-heating as provided in the conventional art. Hence, even when some Doherty amplifiers are intermittently operated, the nonlinearity exhibited by the Doherty amplifiers before the amplifiers are deactivated is easily maintained while the amplifiers are inactive. This allows a high distortion compensation performance to be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A Doherty amplifier system comprising:
   a substrate having a front surface and a back surface;
   a first Doherty amplifier to operate in a SISO communication mode and in a MIMO communication mode, the first Doherty amplifier comprising a first carrier amplifier and a first peak amplifier, each arranged on one of the surfaces of the substrate; and
   a second Doherty amplifier to operate in the MIMO communication mode but not to operate in the SISO communication mode, the second Doherty amplifier comprising a second carrier amplifier and a second peak amplifier, each arranged on one of the surfaces of the substrate, and
   wherein a distance between the first carrier amplifier and the second carrier amplifier is less than any of a distance between the first carrier amplifier and the first peak amplifier, a distance between the first carrier amplifier and the second peak amplifier, a distance between the second carrier amplifier and the first peak amplifier, and a distance between the second carrier amplifier and the second peak amplifier,
   a distance between the first peak amplifier and the second peak amplifier is less than any of the distance between the first carrier amplifier and the first peak amplifier, the distance between the first carrier amplifier and the second peak amplifier, the distance between the second carrier amplifier and the first peak amplifier, and the distance between the second carrier amplifier and the second peak amplifier, and
   in the SISO communication mode, heat generated by the first Doherty amplifier is conducted to the second Doherty amplifier to warm up the second Doherty amplifier which operates in the MIMO communication mode following the SISO communication mode.

2. The system according to claim 1, further comprising an enclosure whose thermal conductivity is higher than that of the substrate, the enclosure accommodating the first carrier amplifier and the second carrier amplifier.

3. The system according to claim 2, further comprising a third Doherty amplifier comprising a third carrier amplifier and a third peak amplifier, each arranged on one of the surfaces of the substrate, the third Doherty amplifier having a longer operating time than the first Doherty amplifier and the second Doherty amplifier, wherein the third carrier amplifier is arranged between the first carrier amplifier and the second carrier amplifier.

4. The system according to claim 2, wherein the first carrier amplifier and the second carrier amplifier are arranged on one surface of the substrate, and the first peak amplifier and the second peak amplifier are arranged on a surface of the substrate opposite to the one surface of the substrate.

5. The system according to claim 4, further comprising impedance conversion circuits, each of the impedance conversion circuits comprising:

a first impedance converter arranged on the one surface;
a second impedance converter arranged on the opposite surface and providing an impedance conversion function substantially equal to that of the first impedance converter; and
a via which makes the first impedance converter and the second impedance converter electrically continuous.

6. The system according to claim 2, further comprising a third Doherty amplifier comprising a third carrier amplifier and a third peak amplifier, each arranged on one of the surfaces of the substrate, the third Doherty amplifier having a longer operating time than the first Doherty amplifier and the second Doherty amplifier, wherein the third peak amplifier is arranged between the first peak amplifier and the second peak amplifier.

7. The system according to claim 1, further comprising an enclosure whose thermal conductivity is higher than that of the substrate, the enclosure accommodating the first peak amplifier and the peak carrier amplifier.

8. The system according to claim 7, further comprising a third Doherty amplifier comprising a third carrier amplifier and a third peak amplifier, each arranged on one of the surfaces of the substrate, the third Doherty amplifier having a longer operating time than the first Doherty amplifier and the second Doherty amplifier, wherein the third carrier amplifier is arranged between the first carrier amplifier and the second carrier amplifier.

9. The system according to claim 7, wherein the first carrier amplifier and the second carrier amplifier are arranged on one surface of the substrate, and the first peak amplifier and the second peak amplifier are arranged on a surface of the substrate opposite to the one surface of the substrate.

10. The system according to claim 9, further comprising impedance conversion circuits, each of the impedance conversion circuits comprising:

a first impedance converter arranged on the one surface;
a second impedance converter arranged on the opposite surface and providing an impedance conversion function substantially equal to that of the first impedance converter; and
a via which makes the first impedance converter and the second impedance converter electrically continuous.

11. The system according to claim 7, further comprising a third Doherty amplifier comprising a third carrier amplifier and a third peak amplifier, each arranged on one of the surfaces of the substrate, the third Doherty amplifier having a longer operating time than the first Doherty amplifier and the second Doherty amplifier, wherein the third peak amplifier is arranged between the first peak amplifier and the second peak amplifier.

12. A transmitter comprising:

a signal processor which carries out signal processing on two baseband signals in the MIMO communication mode and carries out signal processing on one baseband signal in the SISO communication mode;

a radio processor which carries out processing for converting the two baseband signals into two radio-frequency signals in the MIMO communication mode and carries out processing for converting the one baseband signal into one radio-frequency signal in the SISO communication mode;

the Doherty amplifier system according to claim 1 which allows, in the MIMO communication mode, the first Doherty amplifier and the second Doherty amplifier to amplify power of the two radio-frequency signals and output two amplified signals and allows, in the SISO communication mode, the first Doherty amplifier to amplify power of the one radio-frequency signal and output one amplified signal; and an antenna group which transmits the two amplified signals in the MIMO communication mode and transmits the one amplified signal in the SISO communication mode.

* * * * *